United States Patent [19]

Peters

[11] Patent Number: 5,346,046
[45] Date of Patent: Sep. 13, 1994

[54] AUTOMATION CONTROL WITH IMPROVED OPERATOR/SYSTEM INTERFACE

[76] Inventor: John M. Peters, 8930 Mills Ave., Whittier, Calif. 90605

[21] Appl. No.: 55,666

[22] Filed: Apr. 29, 1993

Related U.S. Application Data

[63] Continuation of Ser. No. 690,101, Apr. 23, 1991, Pat. No. 5,243,513.

[51] Int. Cl.⁵ .................. F16D 65/14; G09F 13/34; G05G 1/00
[52] U.S. Cl. .................. 192/142 A; 40/524; 40/550; 74/10.2; 188/82.3; 188/82.7; 364/188
[58] Field of Search .......... 74/10 R, 10.2, 526; 188/82.3, 82.7; 40/438, 472, 524, 525, 447, 550; 340/706, 753, 757, 762; 192/142 R, 142 A; 364/188, 190, 480

[56] References Cited

U.S. PATENT DOCUMENTS

| | | | |
|---|---|---|---|
| 3,294,446 | 12/1966 | Fontaine | 188/82.3 X |
| 3,633,718 | 1/1972 | Wanner et al. | 192/142 R X |
| 3,727,214 | 4/1973 | Wayne | 340/762 X |
| 4,099,172 | 7/1978 | Montanari et al. | 340/762 X |
| 4,139,872 | 2/1979 | Tachi | 360/72 |
| 4,161,001 | 7/1979 | Sakamoto | 360/10 |
| 4,187,544 | 2/1980 | Larner | 364/514 |
| 4,658,940 | 4/1987 | Ulmann | 188/82.3 X |
| 4,859,922 | 8/1989 | Tauchenitz et al. | 318/628 |
| 5,191,320 | 3/1993 | MacKay | 340/706 |
| 5,243,513 | 9/1993 | Peters | 364/188 |

*Primary Examiner*—Allan D. Herrmann
*Attorney, Agent, or Firm*—Lyon & Lyon

[57] ABSTRACT

An endless manual control for use in automation systems, such as automated recording consoles, which controls levels and other parameters of audio, video and other signals, by generating, storing, sending and receiving electronic control signals. The control's internal circuitry translates control movements into electronic signals describing the control's movements. These electronic signals, including external electronic signals which are inputed during certain modes of operation, are fed into a circuit for updating the circuit's memory of control levels. When either the minimum or maximum control level extreme is reached, the circuitry triggers a mechanism to stop the manual rotation of the control in the direction which had or would have caused that control level extreme to be reached.

8 Claims, 7 Drawing Sheets

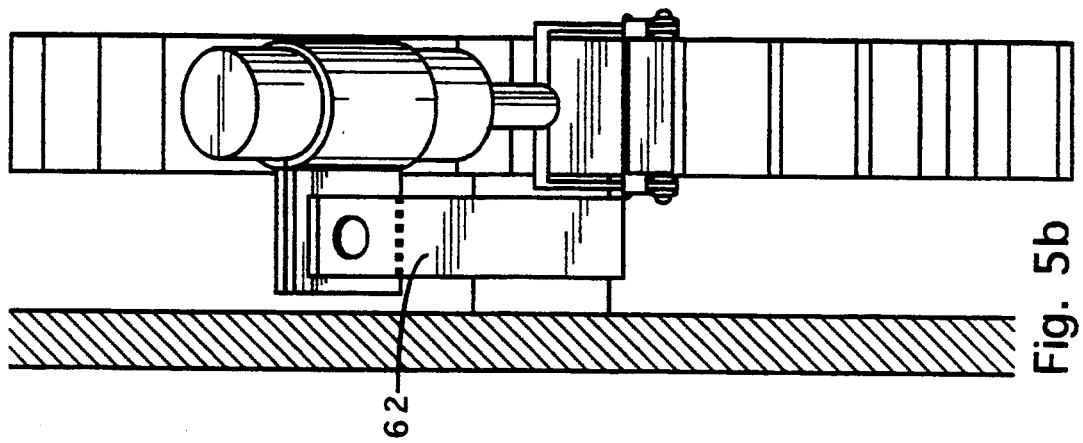
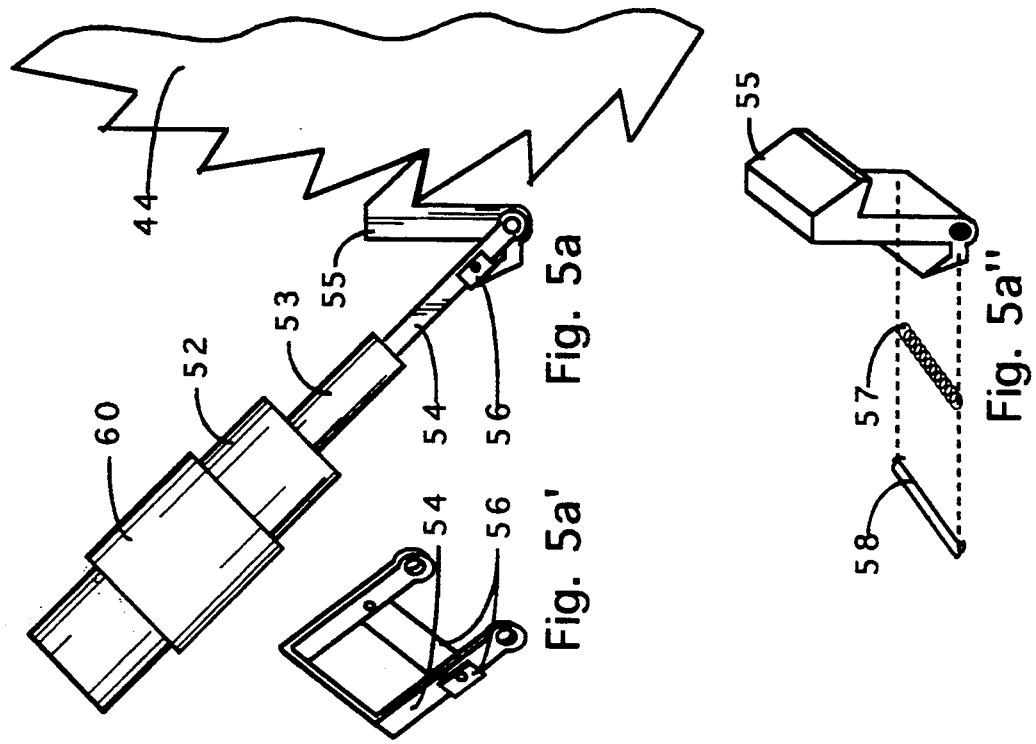

AUTOMATION CONTROL WITH IMPROVED OPERATOR/SYSTEM INTERFACE

This is a continuation of co-pending application Ser. No. 07/690,101, filed on Apr. 23, 1992, now U.S. Pat. No. 5,243,513.

BACKGROUND

1. Field of Invention

This invention relates to the operator-system interface of automation controls on audio recording consoles and other computerized systems.

2. Description of Prior Art

In order to fully understand the present invention it is necessary to describe prior art and practices in some depth.

In recording studios where the sound production for records, tapes, motion pictures and the media occurs, the central piece of equipment is the recording console. It coordinates the operation of all other audio equipment in the control room. The recording console contains many controls for functions such as tile variable control of loudness, stereo balance, equalization and much more. Before the 1970s, recording consoles were relatively small and manageable due to the fact that studio tape recorders had relatively few tracks., from one to about eight. The more tracks that were available, the more it was possible to record instruments on separate tape tracks and this gave recording engineers more flexibility in making stereo mixdown decisions later on for the intended end product. From the 1970s to the present day, tape recorders with sixteen, twenty-four and more tracks have became available, and recording consoles have become much larger and more complex so as to facilitate the mixing of all those tracks. Individual engineers often found it difficult or impossible to manage a great many control changes by themselves throughout a song or other audio production. For example, an engineer may have successfully managed to create a complex mix that was just right in every detail but one. Then the entire difficult mixing process would have to be run through again to include the one additional adjustment, with attendant possibility for error in remixing previous parts. Often, one or more additional engineers would have to be called in to handle the many simultaneous mixing moves that were needed on a complex or "busy" mix.

The solution to this problem was to introduce computer-assisted mixing for the engineer on the recording console. A means was devised to automate the series of linear-throw volume controls, called faders, across the lower portion of the console's control surface. This left the vast majority of the other variable controls on the console surface, usually all rotary controls, unautomated. However, the greatest amount of continual, dynamic mixing is made through the main faders, and so automating them helped the recording engineer considerably in his work.

Today, when working on an automated console, a recording engineer begins a stereo mixdown by playing the multitrack master tape and adjusting fader knobs up and down just as he had in the past. However, the mixing done on the faders by the engineer is "remembered" by the console's central processing unit (CPU). After a song has been played through and mixed, the engineer can rewind the tape and play it back, and all the fader levels he mixed are automatically reproduced including all static and changing levels, it is then a relatively simple matter for the engineer to continue to go back and do additional mixing as necessary without having to redo all of the work he had done previously. It also makes the refining of a complex production requiring twenty, thirty or more mix passes immensely easier. The vast majority of mixing decisions from previous mix passes that were satisfactory continue to be reproduced automatically, while the engineer can concentrate on subtler and subtler refinements. This technology, in large part, makes possible the high quality, state-of-the-art recordings and soundtracks heard today.

The first type of automated fader was the voltage controlled amplifier, or VCA, fader. Whereas on nonautomated consoles a fader controls an audio signal directly with a variable resistor, the VCA fader varies a voltage representing a changing audio level in a voltage controlled amplifier. When a VCA fader is placed in the write mode, all control voltages generated by movements of the fader that the engineer makes are recorded in the automation computer as digital codes representing the control voltages. When the VCA fader is placed in the read mode, the fader's knob does not move, but all of the audio control levels previously written in digital code are reconverted to voltages and sent again to the VCA. In this manner, audio levels are reproduced during automated playback. The computer system also provides a mode called update or relative update for each channel fader for the purpose of programming refinements to a fader's overall recorded control levels while preserving the previous, individual "moves." In technical terms, update is the adding of additional amplitude modulation to a previously amplitude modulated signal.

In spite of the convenience of VCA fader automation, it contains certain idiosyncrasies that an engineer must contend with. For example, if an engineer wants to rewrite a section of a track in the middle of a mix, he usually cannot simply push the write button and begin mixing. The instant that he pushed the button, there would be an abrupt jump in loudness between the previously programmed level at that moment in the recording and any new level represented by whatever position the fader's knob now happened to be in. The engineer has no way of knowing where the knob was previously set at that point (unless he had memorized it) and therefore he cannot move the knob to the correct point in advance to match it. Alternatively, if an engineer wants to update a track at any point in the recording using the update mode, he must contend with other hindrances which vary according to the different existing VCA fader systems and the general characteristics of VCAs. Most of the, problems with VCA faders relate to the function of update, as described below:

a) In previous systems, update required that the fader knob be set in advance to a special position called a null point at a median distance along its throw. At this null point, the new update level is ready for perfect matching to any previously programmed control levels, regardless of what they were. When update is punched in anywhere in the audio mix, it will be entered without causing an unacceptable sudden jump in audio level. However, the position of the knob during update is no longer representative of the audio base level which was programmed during a previous pass. This adversely alters the natural physical headroom, positioning and "feel" of the fader for the engineer. More seriously, however, the engineer may now be severely limited in terms of what he can do. If, for example, the original knob position and corresponding audio level was near the bottom of the throw, and the engineer now desires to make a considerable increase in fader level, he no longer has the physical headroom to do so. Starting from the median null point, his fader's knob will come to an abrupt stop at the physical top of the fader's throw, which is a far smaller travel than starting near the previous knob position which was recorded near the bottom of the throw. Conversely, if the originally programmed level was nearly full open, that is, with the fader knob near the top of the throw, and the engineer, now mixing in update mode, desires a fade out which he must do from the null position, he will find that he can bring the fader's knob to the very bottom of the throw without being able to completely fade the channel out. Finally, the engineer has to be careful to return any faders in the update mode to their null points before the end of a mix pass, otherwise an abrupt jump in level will occur when switching out of update. The engineer has to be careful since it might be difficult or impossible to return more than one or two faders to their null points quickly yet smoothly before the end of a mix pass, depending upon how "busy" the mix was.

b) Some previous VCA automation systems featured a null rather than a null point. This made positioning of the knob to null position a less exact and time-consuming process. However, this simultaneously provided a potential for even greater position and audio level disparity than has been described in a).

c) Most of today's systems no longer require that the fader be preset to any null point or range at all during update, and any position that the fader is in is designated as the null point upon each start of a programming pass. Therefore, the fader is ready for update, or is at least in the null mode, automatically, at any time that update is initiated. However, just as the null range described in b) could throw off knob headroom even more than the null point of a), so does this system potentially create the most extreme headroom problem of all. For example, a fader could be entered into update mode when the fader's knob is at the very top of its throw with perfect level matching, but with no capacity at all to increase levels. If the fader's knob were at the bottom, fader level could not be reduced by any amount. This degree of restriction is partially dependent on how predictable or unpredictable and complex the mix is, and how much time the engineer has to spend in advance to readjust controls to try to assure that most controls will probably have all the headroom that they need.

d) Even on the world's only fully automated recording console, the Series Ten by Harrison Systems, which provides automation of all variable controls across its control surface, update for the extra controls proved to be unworkable and unmarketable using conventional technology. On the Series Ten, the quantity of potentiometers was greatly reduced by making a smaller number of potentiometers multi-functional, that is, function-assignable. In Harrison's attempt to provide update on the potentiometers above the channel faders, they decided to go back to operating the control similar to the way as was described for faders in "a" above. That is, it was always necessary for the operator to adjust a potentiometer to a precise null point before update with that control could be considered. In this case, however, the null point was not always the same arbitrary position as described in "a" above, but at whatever previous position exactly matched, and was therefore an accurate physical representation of, the actual audio control level. This null point would have to be painstakingly matched by the engineer, the match being successful and indicated when a light emitting diode came on. This was apparently Harrison Systems' attempt to always provide full headroom at all times for all potentiometers, which this often accomplished, as opposed to the typical VCA complications described above. However, primarily due to the confused knob positioning their system caused, which is related to the potentiometer's inability to physically track dynamic moves from the previous mix even after it had been "nulled." update for potentiometers had to be abandoned on the Series Ten. For one thing, every time that it was desired to stop and then continue mixing in the middle of a song, any potentiometers in the update mode with previous dynamic programming would have to be physically reset to match the current base audio levels existing at that instant. For another, since Harrison was using potentiometers that were function-assignable and therefore required two operator moves per adjustment—choosing the function and then adjusting the control—the Series Ten, already a slow console, proved to be doubly slow. Cinema mixing engineers, for example, have complained that the Series Ten is too slow for their work, and that instead of a few assignable controls, they want many single-function "grab and go" controls. And yet, the Series Ten is not all that slow when the fact that it is fully automated (now minus update on potentiometers), is taken into account. Total console memory speeds up many aspects of the mixing process, especially the recreation of a previous mix. The Series Ten, the most advanced and expensive recording console in the world, simply represents another compromise.

e) Although quality can be quite high, many engineers claim to be able to hear subtle distortions that VCAs may add to audio, as compared to the measurably cleaner audio signals in standard, nonautomated controls.

So, even with most of today's VCA faders which have no localized null point or range, an engineer must constantly reset faders as necessary to reduce the likelihood of running out of physical and operational headroom. If he wishes to be prepared to move any faders once he stars an update mix pass, he must adjust them all to some median point along their throw. Since the typical console today has at least twenty-four to forty-eight or more faders across the lower portion of the console, doing this can be time consuming as well as a constant encumbrance to the creative flow in the studio. If a song is, say, three minutes long, an engineer may need to take the time to readjust faders every three minutes or at the end of each mix pass. Engineers either never bother to prepare fully for update, or they may resort to primitive measures such as taking a yardstick to collect all faders and press them fully down, then move them all up to equal median positions along their throw. Again, it must be remembered that, in spite of this, the faders may still run out of headroom, causing problems such as being unable to fade a channel completely out. This is part of the reason why it would not make mixing a great deal easier to add conventional automation capability to all of the other controls on the console surface which number in the hundreds. Nearly all the other controls are rotary controls, where one cannot even use the trick of a yardstick to quickly set them to a median range. Plus, as described for the Harrison Series Ten, it would be essential for the physical position (rotation) of the knob to be correct and exactly match its individual previous physical position. Also, with dynamically changing levels, the previous physical position of each control on the Series Ten is different from point to point throughout a song, requiring still more resetting each time it is desired to start automated mixing from a new point. And on any fully automated console, resetting to an exact null point would also be unavoidable in the case of a panoramic potentiometer, or pan pot, which is used to "pan" a signal anywhere from left to right in the stereo panorama. The position line on the top of the knob or the protuberant pointer along the knob's vertical length should always be a perfect indication of its true pan position, another reason that the engineer must take the time to match levels precisely before updating. Even if it didn't cause a level jump by not resetting the control, if the representative position of rotary knobs were allowed to vary from the audio base level of a previous pass, mixing would become immensely confusing. Imagine trying to make adjustments on a pan pot when its knob is visually indicating a pan somewhere to the left of center while the actual panned balance is somewhere right of center. The same situation applies to other functions such as the one controlled by the frequency knob of a channel equalizer, for example. If the knob is pointing at 400 hz, then the engineer has to know that the knob is telling him the truth, instead of modifying frequencies at somewhere above 1,000 hz.

Another somewhat hidden and subtle awkwardness in VCA faders is that the engineer does not have the advantage of a fader knob position which always gives him an anchored, reassuring level indication to help him make further mixing decisions. For example, on an "old-fashioned" nonautomated fader, any knob position consistently represents an exact audio level. This is very helpful to the engineer in making present and future mixing decisions based upon its position in past mix attempts. The engineer, in other words, does not always have to rely one-hundred per cent upon his ears at all times, but is aided by visual physical reference points, not only for one particular fader, but also for the comparative levels of all faders across the length of the console. For example, an engineer can get used to, and rely on, the sonic meaning of certain knob positions in relation to the sound it is controlling in a particular song and the relation of other knob positions to the overall mix. This aspect is of importance particularly when a very fine, precise mix is desired requiring knob movements of small fractions of an inch, against the lined and numbered escutcheon on the faceplate below the knob. VCA faders, who's relative knob positions to audio levels become grossly inaccurate after the first mix pass due to updating, take away this reference point that engineers otherwise enjoy on nonautomated faders.

The second type of automated fader which has been available since the mid nineteen-seventies is the motorized fader. This fader is essentially the same type as the standard nonautomated fader, both using a carbon-based or conductive plastic wiper variable resistor element. The main difference is that this automated fader uses a motor. A motorized fader is initially moved up and down by the engineer, just like any other fader. However, when a mix is played back, the motor is engaged and the knob moves up and down by itself along its throw, duplicating the actual physical moves that the engineer had just made. The motorized fader has certain advantages over the VCA fader. Probably its most important advantage is that the motorized fader's knob position precisely corresponds to its actual audio level at all times. It is probably for this very reason that, although the British-made motorized faders were at first laughed at by American engineers as being clumsy and archaic, they have, for lack of anything better, become arguably the most popular type of automated fader today. When the motorized fader's knob is near the bottom of the throw, audio level is low. When the knob is near the top of the throw, audio level is high exactly like a nonautomated fader. A motorized fader never needs to be reset, eliminating the time-consuming resetting, and continual gaging of the current existing headroom, of VCA faders. Another advantage of the motorized fader is, unlike the VCA fader which may produce audible distortions, the motorized fader's audio signal is exceptionally clean and clear. And, with a motorized fader, it is also possible to enter the write mode at any time without any abrupt jump in audio level. This is because the motorized fader knob remains in the same position when punched into write mode as it was at the last moment of the previous read mode, and any particular knob position in a motorized fader consistently represents the exact same level for that position in all modes and at all times.

However, the motorized fader has its own compromises:

a) It has always been considered a practical impossibility to motorize all of the variable controls on the console surface. Motorized faders are expensive, and if all potentiometers on the console were automated as well, the expense could add thousands or even tens of thousands of dollars to the cost of an average or state-of-the-art recording console. Therefore, total console automation has never been possible, or at best, is not practical, with motorized controls.

b) Another concern in adding so many motors in a console surface is that they could induce electrical interference in the audio signal as well as greatly increase current consumption.

c) Motorized faders, like any other motors with moving parts and mechanical stress and wear, are subject to degradation of quality and accuracy and to early breakdown as compared to non-motorized controls.

d) Originally, update was impossible on motorized faders. Currently, on motorized faders such as the Neve Flying Faders, it is possible, although awkward, to add update. Since knob position is absolutely tied to audio level in a motorized fader, it is impossible to guarantee that update will occur at the actual time that the engineer is making the adjustment. At the time that his finger is on the fader's knob, stopping any attempt by the motor at physical travel from previous programming, the fader is arbitrarily forced into the write mode. During that time of adjustment, any concurrent, previously written changing fader levels are stopped, and, in effect, erased. It is only after the engineer removes his finger that true, non-destructive update is enabled.

e) Motorized faders can be awkward to catch "on the fly." An engineer can reach for a motorized fader to make an adjustment, and he may find it suddenly flying away from his hand!

f) Finally, there is limited space for adding motorized rotary controls in the tightly packed area of channel electronics above the faders in most if not all existing consoles.

Both VCA and motorized faders share some other disadvantages in common. It is awkward to swap their control functions with other controls. For example, towards the end of a recording session, it is occasionally useful to swap the control functions of a channel's input fader and monitor potentiometer. This is done when it is desired to use the console's monitor potentiometers to continue to record overdubs (backup vocal parts, etc.) while using the faders to start the mixdown which has already been approximated on the monitor potentiometers, thereby saving considerable time. The difficulties are as follows:

a) In the case of swapping VCA faders and potentiometers, the physical headroom of each control would be altered with the attendant physical headroom problems previously mentioned.

b) Motorized faders and potentiometers cannot be swapped during the middle of operation since this would cause a momentary abrupt change in audio levels as the motorized faders swapped their audio connections and physical positions.

Assignability is similar to swapping. Assignability is the ability to switch a control from controlling one signal to another, including that of a completely different function. Neither conventional VCA or motorized console faders are easily suited to this job, because:

a) With VCA faders, headroom immediately changes with the attendant problems listed above. Also, some assigned functions require different different VCA fader or pot throw and turn ratios, and function is compromised, again mainly due to the knob position and headroom problems.

b) With motorized faders, at best, levels would momentarily jump as described above for control swapping in the middle of a function. Also, motorized faders contain a variable resistor element which is only capable of controlling other electrical signals who's control requirements are matched to the particular resistor element in that fader.

It should be reiterated that on automated consoles, all the other variable controls (mostly potentiometers) aside from faders are not automated except on Harrison's Series Ten. (The Series Ten uses resistor ladders known as digitally controlled attenuators, or DCAs, for control of audio signals, but these are essentially the same as VCAs in terms of their described difficulties.)

A number of consoles provide a visual display unit (VDU), also known as a cathode ray tube (CRT). One of the main purposes of a VDU is to provide "snapshots" of all the controls on the console surface. In other words, it displays graphics to show control settings for a particular mix, or for any given moment within a mix. This makes it possible for a master tape to be more easily remixed at a later date, the snapshots providing a visual guide to resetting all of the controls by hand to their previous settings. This is helpful, but nevertheless remains a time-consuming task. A close up snapshot view only shows a fraction of the console's controls at a time. As soon as one section of the console is reset by hand, the VDU is switched to display another section of the console, and so it goes until the entire process is complete.

Live recording and sound reinforcement situations, such as large rock concerts, magnify all the disadvantages of VCA and motorized faders to a great degree. In live situations, mixing consoles have to be extremely fast and forgiving. In the studio environment, if an error is made, one can go back and correct it—indeed, even refine it to the nth degree. No such luxury exists in live sound mixing. A mistake can be heard instantly by forty-thousand people. Live sound engineers cannot afford the possibility of running out of fader headroom. It would be disastrous, for example, to be out of downward headroom on a fader when an ear-shattering feedback suddenly occurs on that fader's channel. Thus far, live mixing has been done either on entirely nonautomated consoles, or, rarely, very gingerly with limited automation on automated consoles.

It will be appropriate, momentarily, to discuss specialized controls which thus far have not been used on recording consoles. But first, it is necessary to explain that the previously described VCA and motorized variable controls on the console surface, as well as better than ninety-nine percent of all variable controls used in the world today are known as hard controls and ended controls. Hard means that the control function is fixed or invariable. Ended means that the control comes to a physical stop when either of its two operational extremes are reached. A hard control is typically ended and an ended control is typically hard. With linear-throw knob faders, the physical stop is at the top or bottom of the throw. With potentiometers, knob rotation spans less than three-hundred and sixty degrees before stopping, most commonly from the seven-o'clock to the five-o'clock position, or spanning three-hundred degrees. Inherent in a hard or ended control is the fact that the knob is always in a particular position relative to its two operational extremes. There are other types of controls called soft controls and endless controls. The term soft refers to the ability of the control to be assigned to control different signals—its function is unfixed and variable. An endless control has no physical stop at either of its two operational extremes and can be rotated beyond them. A linear-throw fader's knob is replaced by an endless belt. A potentiometer knob is smooth with no pointer and rotates endlessly. A soft control is typically endless and an endless control is typically soft. Inherent in an endless control, whether it is configured for soft (assignable) operation or not, is the fact that the belt or knob does not have a physical position along its operational range that is an absolute representation of the level it controls—it is positionless. It only has an non-physical operational position in relation to the work it is performing at a given moment. It typically incorporates what is generally known as a shaft encoder, often utilizing optical technology. The control does not "hold" audio control level at a fixed point as do other controls, but rather generates incremental pulses, typically two square waves at a ninety degree offset, to supply information on amount and direction of movement. The control level itself is held and updated electronically (not physically) in memory. Since an endless control never occupies a physical position relative to (nonexisting) physical limits of linear or rotational travel, and since the control can update with incremental pulses endlessly in either direction, it therefore can never run out of operational headroom. Lacking physical stops, it will also never limit physical headroom. Such a control appears to instantly "match" the existing control level of a function assigned to it. Also, using an electronic display to take the place of the usual visual reference of a fader's knob or a potentiometer's pointer, an accurate indication of the true control level can be made visible at all times.

Since an endless control can never be in a wrong, inaccurate, or misleading physical position at any time in relation to the level it is controlling, there is never any of the confusion as to the control level setting that occurs with VCA faders. Also, since there are no limits to the control's physical travel, full headroom for control of normal parameters is available at all times. And since control level matching is automatic, or, more accurately, simply unnecessary since update of control levels is incremental rather than absolute, the recording engineer never has to spend any time resetting controls to null points, or otherwise positioning them to at least hopefully avoid running out of physical and operational headroom. The endless or shaft encoder design can also apply to controls other than level controls, such as stereo balance and equalization controls. In addition, endless controls provide perfect level matching in entering write as well as update modes, unlike VCA controls. Endless controls are not motorized and therefore there is not the possibility of electrical motor noise entering the audio circuitry. Also, since the controls are not motorized, perfect non-destructive update is available at all times without the danger of erasing previous fader moves while the engineer is adjusting the control. Also, unlike motorized controls, endless controls will not suddenly fly away from the operator's hand when he reaches for them. And, endless controls can swap functions with other controls, or be assigned control functions with stored levels, at any time, without changing or running out of physical and operational headroom, and without any momentary jumps in the levels being controlled. In summation, an endless control solves all of the previously described problems associated with conventional VCA and motorized faders.

Until the present time, the use of soft or endless controls in professional audio has been limited mostly to synthesizers, special effects devices, and so-called digital workstations. On these devices, there is generally only a single endless control provided. Its function, being assignable, can therefore replace a great number of separate controls. To date, the only professional audio console that has incorporated a number of endless pots (but retaining some conventional faders) is not a conventional recording console at all but a compact disc mastering console priced in the $100,000.00 range. It is called The Muse by Audio Animation, Inc. The designers of that console have recognized the special value of endless controls and have used them to great advantage in this impressive, highly-advanced console. Operation is very fast, since there are numerous potentiometers which are assigned fixed functions, and they are, in that sense, also hard controls, which means that the operator does not have to assign them a function before using them. There is also one new recording console, the Crescendo by Euphonix, which incorporates one endless/soft control. It is somewhat slow, however. Unlike the Muse, the Crescendo, having only one of these controls which has to be assigned each function one at a time before each use, is too slow for engineers who insist on "grab and go" operation. All of the Crescendo's other pots are conventional in the sense of being ended controls.

At this point it is appropriate to describe three audio level controls which most closely parallel the invention to be described in this application:

1. The first one was called Memories Little Fader which was introduced by Allison Research in the early 1970s. It was an add-on automation device for consoles and it consisted of an auxiliary rectangular box of faders of the endless belt variety to be used in place of the main, non-automated console faders during automated mixing. Each belt was made of clear plastic which was moved by fingertip pressure through which shown a series of LEDs for display of control levels. The unit was used to provide external mix automation to a recording console through electric cabling, temporarily replacing the console's built-in faders. Memories Little Fader was in production for a few years.

2. The second device is the Endless Belt With Digital Output introduced by Penny and Giles of England in 1989. It incorporates an optical incremental encoder, which is a typical embodiment of the shaft encoder mentioned previously. The Endless Belt With Digital Output is provided as an individual fader unit primarily for audio equipment manufacturers to mount or retrofit directly into audio systems and equipment. It is similar to a single channel of Memories Little Fader except that the Endless Belt With Digital Output is opaque and a visual display of control levels is not provided with it.

3. A third device is the RC-16 Remote Control by Oxmoor of Birmingham, Ala. It is an endless rotary control with a shaft encoder which has a group of LEDs around the control which the company calls, collectively, a Virtual Pointer, provided for indication of control position. The RC-16 Remote Control is generally not intended for use recording studios but in public address and background music systems. The increments of level change it provides are too gross (large) for professional audio.

It is believed that none of these controls have ever been used in any professional studio recording console.

If the benefits of soft, and especially endless, controls are so great, eliminating all of the headaches and hassles associated with typical VCA and motorized controls, one would think that using endless controls on recording consoles would be obvious. And, being obvious, manufacturers would therefore completely remove all ended controls on their automated consoles and replace them with endless ones.

However, although automated console manufacturers may (or may not) have occasionally toyed with the idea of using endless controls throughout the console surface in the past, it had been an unworkable idea, previously because the required computer power for this type of control was at first unavailable and, later, too expensive. Although these are no longer insurmountable barriers, a second, somewhat subtler difficulty is even more fundamental. In spite of the overwhelming advantages of endless controls, one thing that would be disorientating for engineers/operators in the device thus far described is, paradoxically, the lack of the physical stop at either of the control's operational extremes. The reason it would be disorienting is that a busy engineer, mixing music let's say, is often watching audio program levels on the meter bridge, or looking at and communicating with performers in the studio area, or otherwise has his eyes directed away from the controls he is operating. He often has no time to even glance at a knob or a representative electronic display to see whether he's reached the top or bottom of a threw. The situation would be even more impossible in live situations in which automated consoles, until now, have been largely unusable. In either case, without a physical stop, a stop relayed to the operator by feel, the engineer may, for example, continue to try to increase a level uselessly if the level has already reached the top of the control range. Conversely, he couldn't know for sure when he's brought the fader all the way down and no longer needs to keep turning it down. This feedback cannot be provided by ear. An engineer may attempt to turn up the volume during a silent passage when there is nothing to turn up, but, not knowing this, and with an endless control, he will attempt to do so anyway. He also cannot know if he is fading a channel all the way down if the program is currently at a silent spot, or if the channel in question is being masked by sound from other channels. Similarly, in the middle of a music mix, one may be able to hear the relative loudness of an instrument, but subjective hearing, which is affected by factors such as monitor level settings, does not provide assurance regarding whether the control is full open or not. The lack of a physical step makes an endless control, in spite of all its advantages and even if provided with an electronic readout, completely unacceptable for most if not all recording engineers in conventional professional recording console applications.

The invention described and claimed herein solves all of the problems described above for VCA, motorized, hard, soft, ended and endless controls. It is the world's first ended/endless control.

OBJECTS AND ADVANTAGES

Until now there have been two methods of programming the automation of levels in audio consoles and other programmable systems: Conventional motorized and VCA faders.

The present invention makes possible a third method. Its objects and advantages are to provide a new form of control, including all of the advantages of VCA, motorized, hard, soft, ended and endless controls in a single package for the first time. These objects and advantages are:

1. To be applicable to all variable functions on a console's surface, both the linear-throw and rotary-turn types;
2. To provide a similiar capacity for a full range of functions for both faders and potentiometers in an automated console;
3. To make all variable channel controls capable of both write and update mode function and make both modes equally simple to operate;
4. To eliminate the possibility of running out of physical headroom;
5. To provide the physical headroom of fader-throws and potentiometer-turns which precisely matches the operational range;
6. To eliminate the need for manual "null" resetting;
7. To provide continuously automatic and instantaneous mix resetting.
8. To provide all variable "soft" controls with "grab and go" capability under all conditions while retaining optional assignability;
9. To make consoles faster and easier of operation, eliminating time consuming steps, frequent operator/system errors, and also making the advantages of automation more applicable to live audience situations;
10. To eliminate the need for monitor screen displays of control settings which console manufacturer's provide for manual resetting;
11. To provide the capability of instantaneous, glitch-free control swapping;
12. To provide a control that can automatically switch from read to write or update upon merely moving the control;
13. To provide the capacity for variable throw and turn ratios;
14. To provide nondestructive updates at all times as compared to update-destructive motorized faders;
15. To provide a control whose functions can be updated by software changes.

The present invention provides new control functions which encompass: 1, all of the advantages of previous automation controls; 2, none of their disadvantages and; 3, powerful, user-friendly new features. The present control was designed to make fully automated controls on recording consoles and other automated equipment as easy to work with as simple nonautomated controls.

DRAWINGS

FIGS. 1(a) and 1(b) are exterior top views of two embodiments of a fader in accordance with the present invention.

FIGS. 5(a) and 5(b) illustrate an embodiment of a level-activated electromechanical stop.

Figure 6:
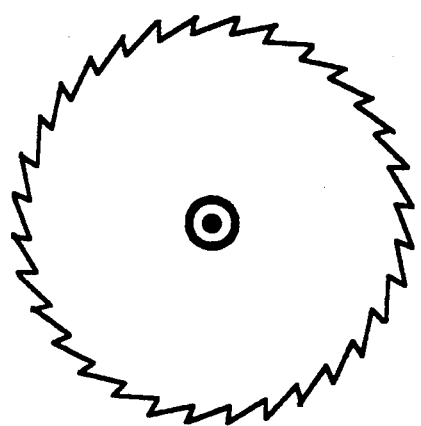

FIG. 6 is the pulley used in the fader version.

Figure 7C:
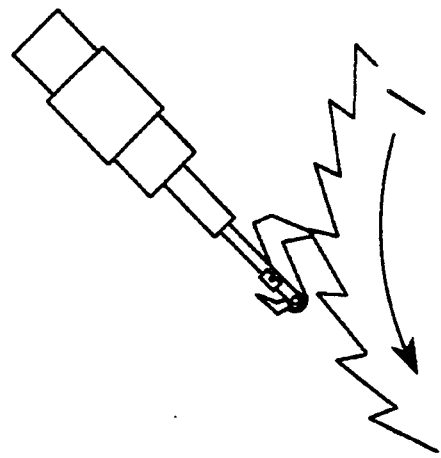
Figure 7B:
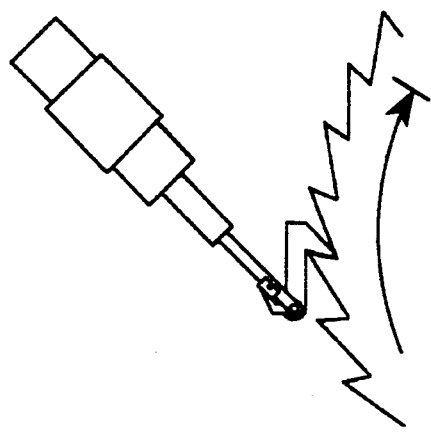
Figure 7A:
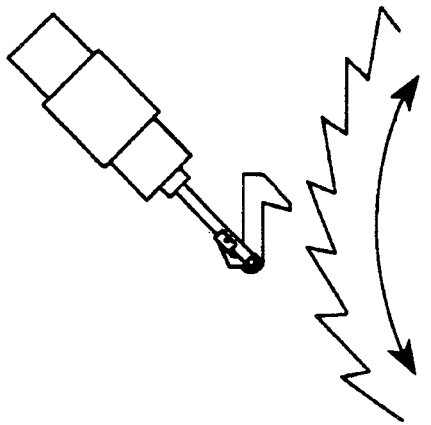

FIGS. 7(a), 7(b), and 7(c) illustrate the interaction of the level-activated electromechanical stop and the pulley in three stages. FIG. 7(a) depicts an electromechanical stop in a disengaged position or "off" position. FIG. 7(b) depicts a electromechanical stop in an engaged position or "on" position. FIG. 7(c) illustrates how the electromechanical stop limits the rotation of the pulley to a single direction.

Figure 8:
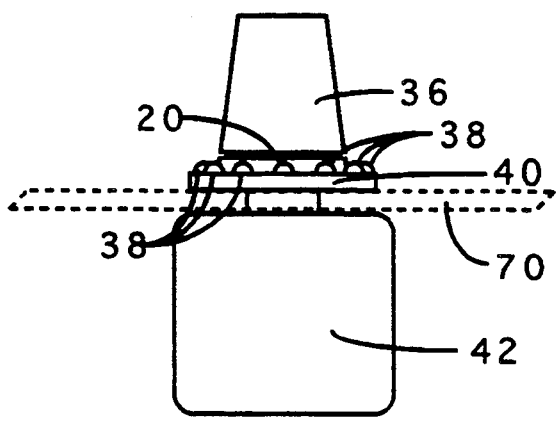

FIG. 8 is an external side view of a potentiometer version of the present invention.

Figures 9A, 9B, 9C:
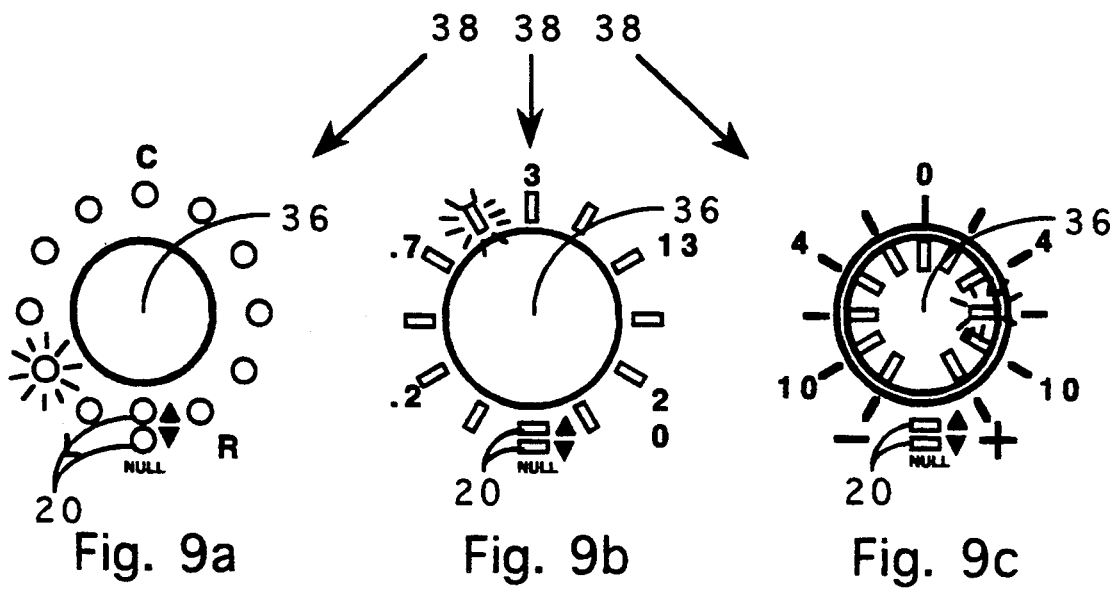

FIGS. 9a–c show an external top view of three embodiments of the potentiometer version.

Figure 10:
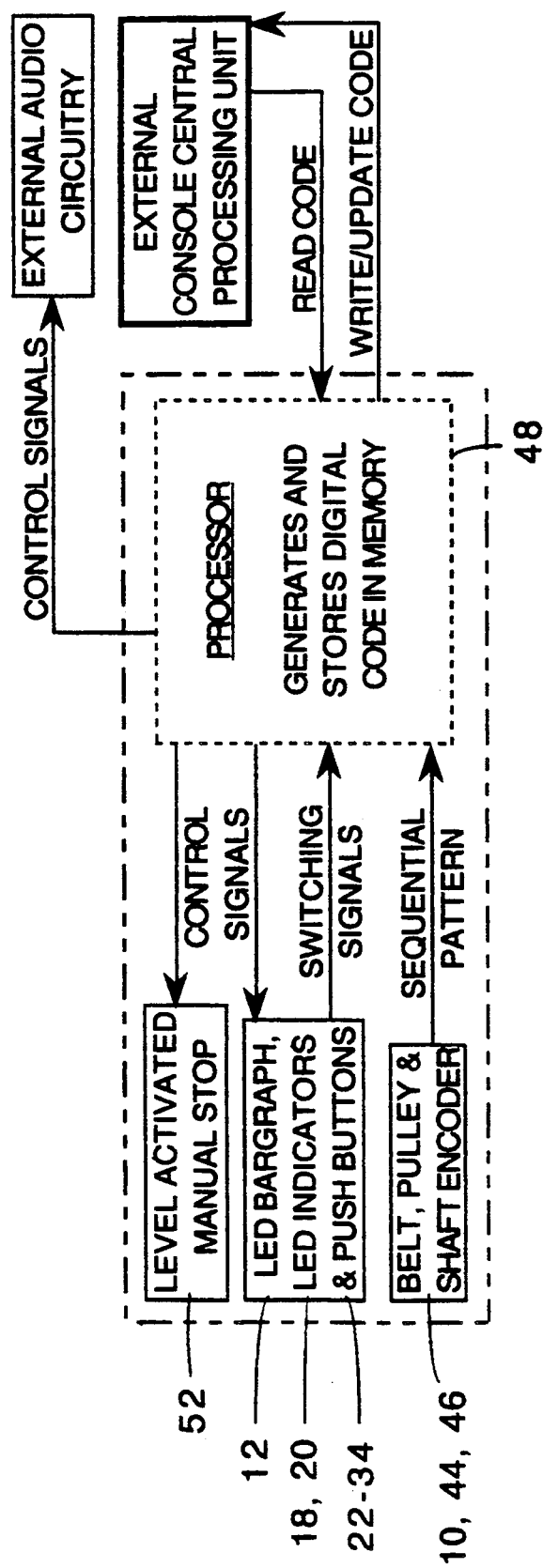

FIG. 10 is a block diagram with all electronic and mechanical components of the present invention within the dotted lines plus indication of console interconnect.

DESCRIPTION

Note: The present invention contains a processor and is intended as a component part of a state-of-the-art automated recording console which typically contains a powerful CPU operating complex software programs. As such, it will first be necessary to describe the present invention in some technical detail before its special nature can be understood. This detailed technical description begins here. The essential nature of the present invention is revealed in the section Operation.

Figure 1A:
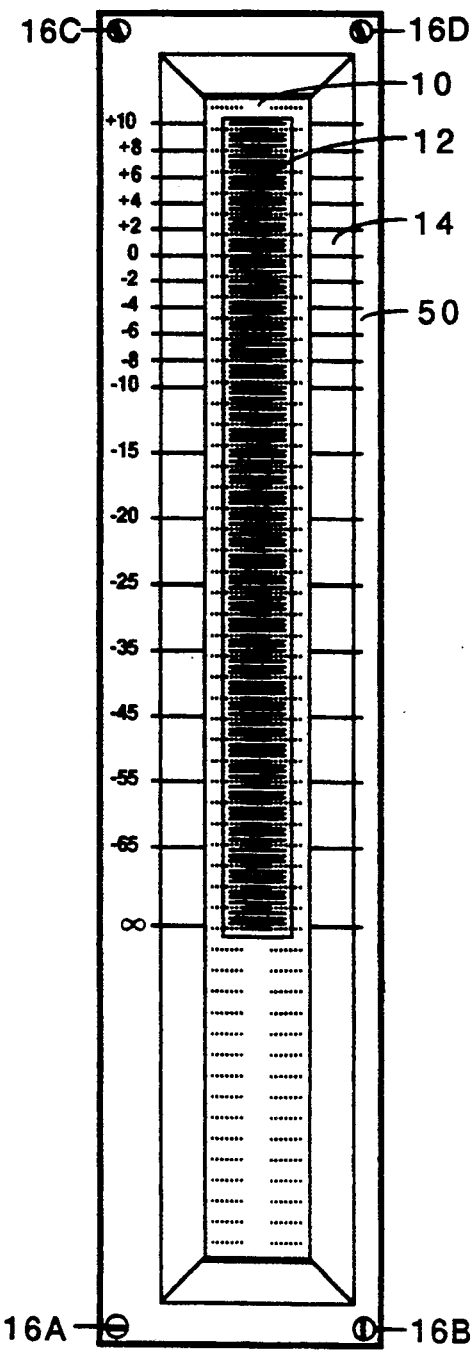
FIG. 1a is a "no-frills" design.
Figure 1B:
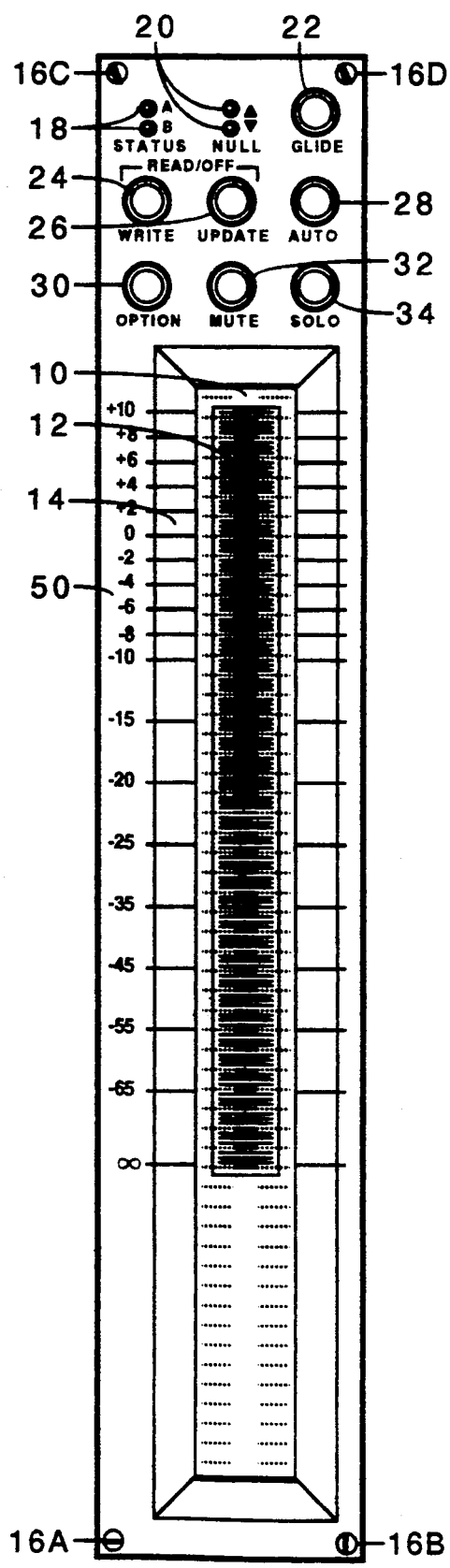
FIG. 1b is a fader supplied with a number of operator controls and indicators.
Figure 2:
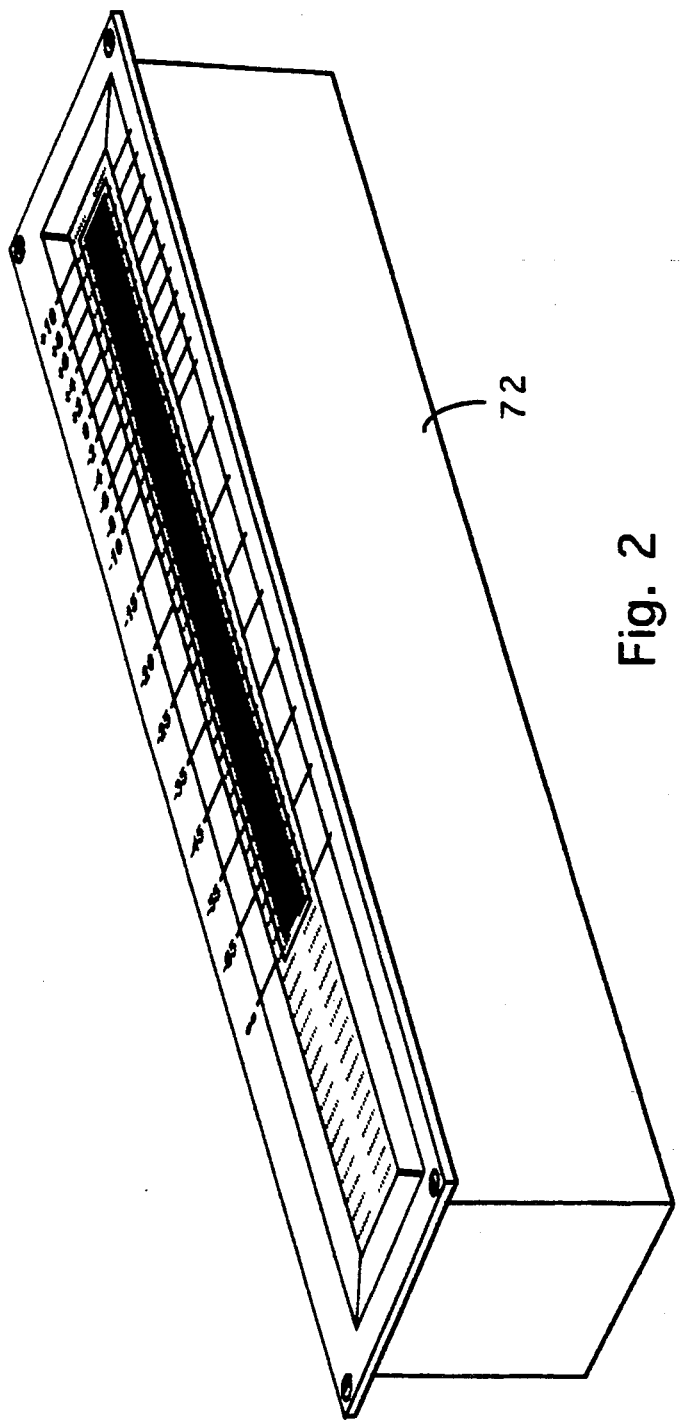
FIG. 2 is an exterior perspective view of the fader version.
Figure 3:
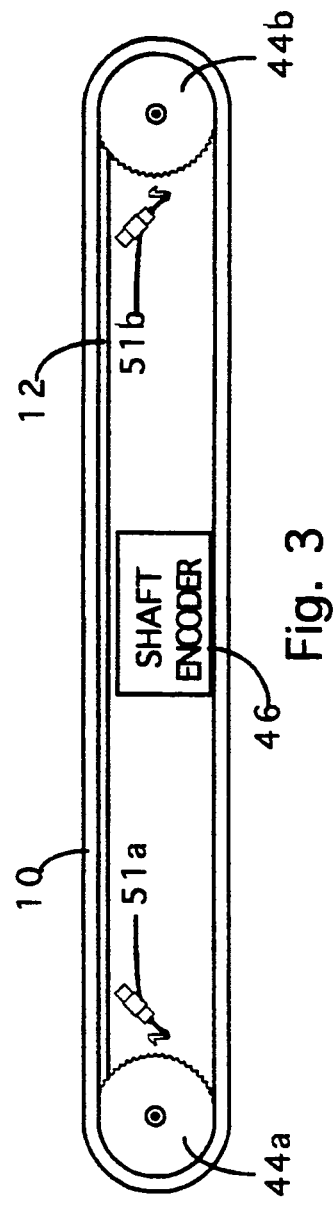
FIG. 3 is a simplified interior side view of the fader version.
Figure 4:
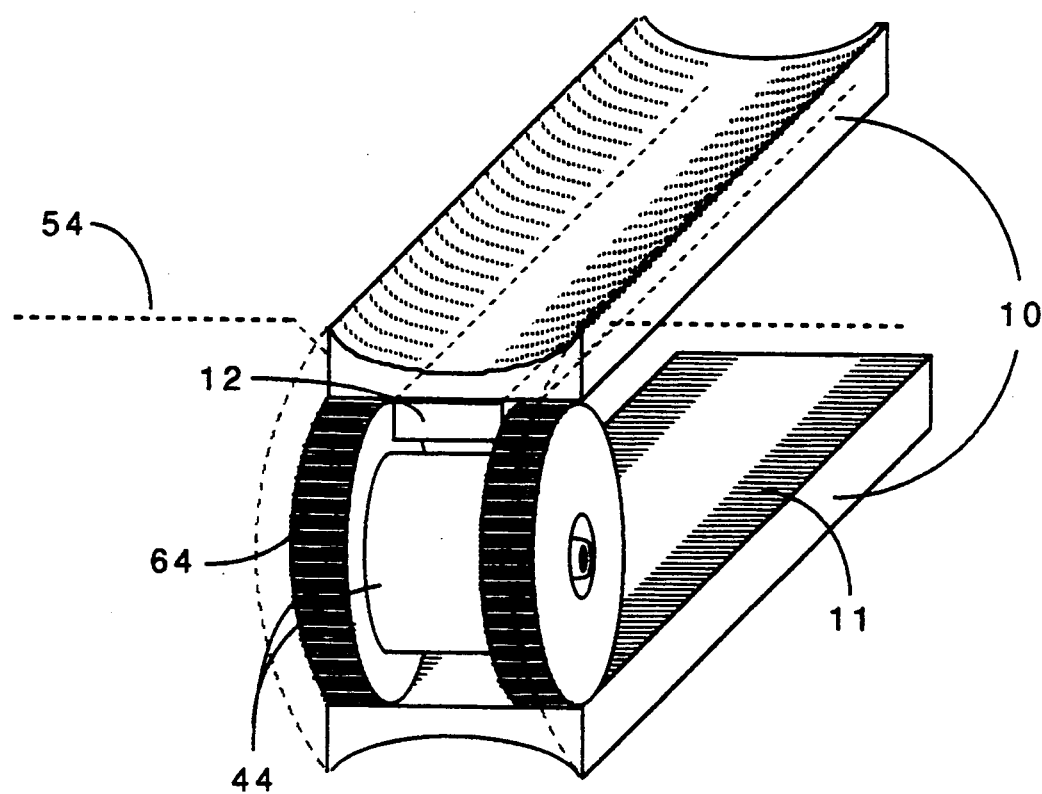
FIG. 4 is a simplified, interior perspective cut-away view of the fader version.

FIGS. 1a and 1b, which are drawn to within 10% of a typical scale, show external overhead views of embodiments of the present straight-line fader for use in automated audio recording consoles. FIG. 2 is an exterior perspective view showing the overall shape of the control and its housing 72. The fader incorporates a circular endless rotatable belt 10 of clear, transparent plastic shown in FIGS. 1a, 1b, 3 and 4. The belt 10 is suspended and pulled into an oblong shape by two fixed pulleys 44a–b shown in FIG. 3 which are supported via hubs at their center to the fader's walls. As shown in FIG. 4, the outer circumference of a pulley 44 has teeth 64 (shown through a magnifying glass) which fit into grooves 11 in the inner circumference of the belt 10 to prevent slippage. The belt 10 may be rotated up or down by fingertip pressure and is ribbed for traction. As can be seen in FIG. 1, the upper horizontal length of the belt 10 is more or less flush with the faceplate 50. A bargraph of dual-color light-emitting diodes 12 is located immediately under the upper horizontal length of the belt 10. The LED bargraph 12 runs parallel to the length of the belt 10 and faces upward towards the operator. The bargraph 12 is visible to the operator as shown in FIGS. 1a and 1b due to the transparency of the belt 10. In FIG. 3, the bargraph 12 appears to run into the pulleys 44a–b, however FIG. 4 shows in a cut-away view how the bargraph 12 fits into a narrower part of either pulley 44 at either end of the belt 10. (In other embodiments of the fader with differing spacing requirments, the pulley 44 may not necessarily require this narrower area.) The belt 10 is, in fact, in contact with the LED bargraph 12, the latter being coated with a suitable clear, frictionless material. The faceplate area as indicated in FIG. 1b contains LED-illuminated push buttons 22–34. The faceplate 50 also contains other LED indicators 18–20 which are not push buttons. The faceplate 50 and bevelled area 14 around the belt 10 contains imprinting for the purpose of gaging control levels and identifying push buttons and LED indicators. Four corners show a typical example of screw holes 16a–d for mounting the fader flush into a recording console. FIG. 1a is a "bare-bones" embodiment for console manufacturers who prefer to supply all their own automation buttons and indicators which are otherwise supplied in a typical embodiment as shown in FIG. 1b.

The interior components of the fader are protectively encapsulated in an enclosure 72 beneath the fader's faceplate, as shown in FIG. 2.

Referring to FIG. 1, the operator of the control moves the belt up or down to change control levels of audio signals. The belt 10, as shown in FIG. 3, drives a rotatable wheel contained within the shaft encoder 46 which generates electrical impulses when the operator moves the belt 10. In another embodiment, the wheel in the shaft encoder 46 may be turned directly, or indirectly through gears, by one of the pulleys FIGS. 44a–b. The shaft encoder 46 electrical impulses may be the pairs of 90 degree offset square waves that are typically generated in these devices or may be any directional sequential pattern which provides information on direction, amount and speed of control movement. The impulses from the shaft encoder 46 are sent to a processor 48 in the fader as shown in FIG. 10. The processor 48 can be a 68000k processor or any suitable integrated circuit which is capable of receiving, storing, updating and outputting digital code. In a common embodiment, it is also a digital-to-analog converter which converts digital code into analog voltages for driving voltage controlled devices. The shaft encoder 46 outputs its electrical pulses through conductors to the processor 48 which contains computer memory of audio fader levels in the form of digital codes. Processor 48 uses the impulses from the shaft encoder 46 during programming modes (write or update) to update the digital code in its memory. Specifically, the fader's processor 48 looks at the quantized fader movements which it is receiving in the form of electrical impulses, accepts each impulse or pair of square waves as representing a single increment of change to the control level code stored in it's memory, and updates the code from that point.

The smoothness of changes in audio level depend upon each increment of level change being so small as to be inaudible in itself, and is an important parameter in quality audio level control. One decibel of change would be too gross for professional quality use whereas one-tenth decibel of change would be far more acceptable. This degree of change-per-impulse is not determined by a typical embodiment of the present fader but by the software of the computer program in a recording console's central processing unit (CPU). However, the number of increments of change for a given amount of manual rotation of the belt 10 is determined by the present fader and must be high enough to provide a full range of audio level control, from "infinity" to "100%," throughout a single throw of the visible length of the belt 10. These are the essential requirements for the proper selection of a shaft encoder for any professional quality audio level control device, including the present invention.

The shaft encoder 46 in the present invention, and any standard shaft encoder, only supplies information for amount and direction of change and it is functional only when the control is moved by the operator. The shaft encoder 46 itself does nothing (i.e., holds no position) when it is not moved. It can be seen, therefore, that an endless linear-throw belt fader (as well as an endless rotary knob potentiometer) has no physical position representative of control level-an endless control is positionless. It only produces impulses for increments of change, not information on absolute level. The "position" of the "knob," i.e., the audio control level, is stored electronically in the processor 48 as digital code.

The processor 48 passes on this code to the console's central processing unit which stores all static and changing digital codes in recorded memory during write and update modes. The console's CPU also returns digital code to processor 48 during read (automated playback) mode. All digital codes between the processor 48 and the CPU also include status switching commands.

Other technology can be used to translate movements of the control into voltage changes for control of voltage controlled or digitally controlled amplifiers. Specifically, the inventor had previously considered that one of the pulleys 44 (FIG. 3) in the present invention that pulls the plastic belt 10 into an oblong shape could be a specially configured potentiometer and operate electrically the same as potentiometers in other existing automation-ready consoles. That is, a pulley/potentiometer would vary a voltage, rather than produce pulses, to provide information on control movement. However, a shaft encoder with incremental output usually is preferable for low noise and low interference and makes it unnecessary to convert analog voltages to digital codes. So, although analog voltages could be used for this portion of the present invention, the digital or incremental method is considered to be generally preferable.

The processor 48 sends control signals through conductors to audio circuits which would typically be located in the recording console. Alternatively, these control signals may be routed through a console's CPU before arriving at audio circuits. The processor 48 also sends control voltages to the LED bargraph 12 for visual indication of level control. The processor 48 sends voltages to the other LED indicators 18–20 and LED push buttons 22–34 to provide further visual indication of operational status. And the processor 48 sends a voltage to an electro-mechanical switching mechanism shown in FIGS. 5a and 5b. This mechanism, a level-activated electromechanical stop, provides switching for stopping or permitting rotation of the belt 10 when certain conditions occur which are described under Operation. The electromechanical stop, one at each pulley 44, is identified by reference numerals 51a and 51b in FIG. 3 (support structure not shown).

When any push buttons 22-34 are pressed they send status switching commands back to the processor 48 which then stores and sends appropriate commands to various components through the circuit paths previously described.

As can be seen in the block diagram of FIG. 10, the signals outputted from the processor 48 which drive the audio circuitry also drive the LED bargraph 12. Each LED in bargraph 12 are about a millimeter or less in thickness (height). 3-5 consecutive LEDs are lit at any one time to provide a visual display of the "knob" position. The bargraph 12 in FIGS. 1a and 1b has LEDs that would provide a resolution of 1/5 of a db of change in audio level in the upper register of the display. Display resolution could be increased to 1/10 of a db by use of an optional circuit modification to cause the LEDs to progress in a 2-on/3-on/2-on sequence. Alternatively, if using thicker (taller) LEDs, display resolution can remain relatively high by using a circuit which fades the LEDs in and out gradually and using a progression such as 1-on/2-on/1-on.

FIG. 8 shows an external side-view of a potentiometer version of the present invention. The potentiometer can contain practically all of the same circuitry as was described for the fader and as shown in FIG. 10. However, on a fully automation-integrated console, the typical embodiment of the present fader contains the processor 48 which is configured to handle the processing of functions for all of the other variable controls (mostly potentiometers) on that console channel in addition to the fader itself. The components from FIG. 10 that a potentiometer would normally contain within its housing 42 would be the shaft encoder 46, the level-activated electromechanical stop 51, and the LED circuitry associated with a circular LED array 38 (in place of bargraph 12) plus the LED NULL indicators 20. The other push buttons and indicators are either unnecessary on the present potentiometer or are served by their existence on the fader in the same console channel. So, in most applications, the present potentiometer would appear to be almost as simple as the embodiment of the fader shown in FIG. 1a, except including the LED NULL indicators 20.

FIG. 9a-c shows three embodiments of a potentiometer version of the present invention for panning FIG. 9a, equalization FIG. 9b and plus-or-minus amplitude control FIG. 9c, respectively. FIGS. 8, 9a and 9b utilize a circular LED array 38, instead of an LED bargraph, mounted on a conductor trunk 40 which contains the conductors for the LEDs. Alternatively, the circular LED array 38 may be mounted against the underside of the console surface and protrude through holes, for display of "knob" positions, and would still be represented accurately as they appear in FIGS. 9a-b. FIGS. 8 and 9a show round LEDs in the circular LED array 38. FIGS. 9b and 9c show the alternate use of rectangular LEDs. The imprinted numbers and letters may be marked on the console surface 70 or the conductor trunk 40. FIG. 9c shows an embodiment of the potentiometer with rectangular LEDs on the top of an inner fixed "knob" that does not move, and which is encapsulated by an outer, transparent, movable knob. FIGS. 8 and 9a-c show the circular LED array 38 as containing 11 LEDs, corresponding to all hours of a time clock except the 6 o'clock position. Other embodiments may contain a greater or smaller number of LEDs in the circular LED array 38. Audio engineers would usually not require as high a display resolution for potentiometers as they do for the main channel faders, which is reflected in FIGS. 8 and 9a-c as compared to the fader's LED bargraph 12. A high resolution display around all channel potentiometers would be prohibitively expensive in a recording console and could be provided by an optional switchable digital counter added to a special embodiment of the present fader or, alternatively, provided by the console manufacturer via a visual display unit (VDU) in a central location on the console. In either case, such a digital counter could be configured to read in fractions of a db, if required, and would be driven by the same digital codes from the fader processor 48 that are sent to and received from the console CPU.

It should be noted that the accuracy of the term "fader" or "potentiometer" for the present control or for any shaft encoder is questionable because, strictly speaking, a fader or potentiometer is generally thought of as channeling and directly controlling an audio, signal as with an internal variable carbon resister. However, recording engineers generally refer to any linear-throw level control as a fader, regardless of how it works, and any turnable knob or dial as a potentiometer, as well. Actually, a VCA fader very often does control the audio signal indirectly from a distance and the Harrison Series Ten console variable controls send signals to digitally controlled attenuators in a central location. However, manual controls, of whatever type, are still referred to as faders and potentiometers by recording engineers who operate the controls. Therefore, this nomenclature has been retained here.

Operation

The operation of the present invention is described here in an embodiment for controlling audio signals in audio recording consoles. In order to explain how the present invention overcomes virtually all of the previously described major problems of operator/system interface specific to today's automated controls, it is necessary to describe how it performs for the recording engineer.

The belt 10 in FIGS. 1a-b on the present fader rotates up and down by fingertip pressure applied at any point along its surface for control of audio levels. As it is rotated the fader level changes and the LED bargraph 12 indicates the control level change in the same way that a physical knob would. Fader control level may thus be observed and, when in programming mode, written into the console's CPU. Upon playback, the LED bargraph 12 displays those same levels in a way which is visually comparable to seeing knob positions on motorized faders. The same concept applies to rotary pots (FIGS. 8 & 9a-c). In this case the control is a round knob 36 with a circular LED array 38 around its edge on the console surface or within the top of the knob 36 (in FIG. 9c). Neither the fader's belt 10 nor the potentiometer's knob 36 has a physical position that, in itself, indicates control level—they are positionless. The fader's LED bargraph 12 and the potentiometer's circular LED array 38 provide the visual reference of the knob in the fader or the pointer or position line on the potentiometer for the purpose of indicating control level settings to the recording engineer.

When update is desired during automated mixing there is no need to set the fader or potentiometer to an arbitrary null position or to worry about physical and operational headroom. It doesn't matter what physical position the fader's belt 10 or the potentiometer's knob 36 was in previously. The controls are essentially positionless and can rotate endlessly. The belt 10 is uniform in appearance throughout its entire length and the rotary knob 36 has no position line on its top or physical pointer along its side. Therefore, the signal level and matching level display do not require the distractions and interruptions of presetting knob positions. Both the control level and the corresponding LED readout 12 & 38 track together automatically under all conditions, the readout automatically displaying the control's "knob" position. Operational headroom throughout the active throw of the fader is never restricted. The physical position of the LED "knob" in the bargraph 12 (FIGS. 1a and 1b) and in the circular array 38 (FIG. 9a–3) is always identical to the write, read or update control levels.

On the fader, the control level readout is a dual-color LED bargraph 12 situated immediately under the transparent plastic belt 10. The LED bargraph 12 indicates fader position by reading green in read mode and red in write, update and automation-off modes. When switching from read to write the fader automatically continues to operate at the same control level in the write mode being entered as it was in the read mode just exited. The LED bargraph 12 automatically tracks control levels accurately. There is never an undesirable jump in audio control levels. The level changes only if the fader is moved. When switching from write or update back to read, the display goes from red to green again and follows previous level programming.

When the end of a mix-pass is reached and the tape parked, the fader "remembers" where its "knob" in the LED bargraph 12 was positioned during the last read, write or update moment, exactly the same as the knob on a motorized fader. If the fader's very next function is write mode or automation off mode, the fader will continue at it's last control level setting until it is moved. If read, then it will follow the console CPU's command for audio and display levels and still be ready for update at any moment.

Since all of the control level and readout updating described above happens instantly and automatically without manual resetting, a console fitted with the present control operates very fast.

When the fader (FIG. 1b) is in the read-ready mode (read and ready for programming), one of the two programming buttons, WRITE 24 or UPDATE 26 is glowing green. If the WRITE button 24 is green, the channel is in read mode and ready to enter the write mode. If the UPDATE button 26 is green, the channel is also in the read mode but ready to enter the update mode. These push buttons 24 & 26 therefore simultaneously give information on, and choice of, the next programming mode to be entered while the read mode is selected. When the master tape is running under these conditions, all that is required to enter a programming mode is for the engineer to move the belt 10 and it is entered instantly. The processor 48 is programmed so that two impulses in one direction from the shaft encoder will be converted to a digital code that tells the console's CPU to enter a programming mode. (By requiring two impulses instead of one the likelihood of accidental triggering is reduced.) If it is desired to go to automation-off mode, the AUTO button 28 is pressed in which case both the WRITE 24 and UPDATE 26 push buttons go out. Pressing the AUTO button 28 again toggles (reverses) the action, that is, returns the control back to the previous auto mode.

One of the most complex functions and greatest potential problem area for operator/system-interface on an automated console, as described previously, is update. The present fader displays update in the following manner: When playing the multitrack tape in read and ready-for-update mode, the fader level positions read green as indicated by the LED bargraph 12. When update is desired, it is selected by either pressing the UPDATE push button 26, or simply by moving the belt 10.

When update is selected by pressing the UPDATE LED push button 26, the "knob" (any LEDs in the bargraph 12 indicating the current: level) remains green at first. At the same time, two amber LED NULL indicators 20 come on. The LED NULL indicators 20, both being indicate that update is identical to the previously written levels and effectively no updating is occurring.

When the fader is next moved up or down, red glowing LEDs in the, dual-color bargraph 12 gradually start appearing immediately above or below the green read "knob" until the red "knob" becomes a separate, discrete point of red. In effect, the red "knob" gradually seems to slip out from under the green " knob"until it becomes fully visible. At the same time, the indication of the null LED indicators 20 changes. When the fader is dead-centered in the null position, where the red "knob" is fully hidden (or nonexistent) and no updating is occurring, both LED NULL indicators 20 glow amber. There is a tiny null range of belt play about that point that is equal to what would be approximately plus or minus one-half to one-quarter db worth of control level change if the belt 10 were active. This tiny range is simply to keep the control from being impossibly touchy for the engineer. As he begins to move the red update "knob" (at this point, invisible) from null by moving the belt 10, it (the belt) first moves several tenths of a db worth of travel (several millimeters) without change in the LED NULL indicators 20. As the movement is continued, one of the two LED NULL indicators 20, on the opposite side from the direction of fader travel, goes to half-brightness, indicating the direction away from dead center of null. The fader is still in the null mode, however, and update is not yet occurring. When the fader reaches the null-off position, the LED 20 that is half-bright goes completely out, and active updating is entered by at least one-tenth of a db. The purpose for this sequence is to give a clear indication of the fader's direction from centered null since the red "knob" may still be invisible if it hasn't "slipped out from under" the green "knob" yet for active updating. In returning to null, first the off LED 20 comes on half-bright, then full-bright. Utilizing the NULL indicators 20 in this manner helps the engineer return the fader solidly to a safe, well-centered null position at any time without having to "go fishing" for it and thereby prevents inadvertently causing additional level updating to already satisfactory control levels.

When leaving the null position, the distance that the red "knob" travels from the green "knob" in the bargraph 12 indicates the, degree of offset from, and amount of level modification being made, to, previously programmed levels. Any amount that green "knob" moves is tracked and reflected in the same amount of movement of the red "∓knob" as well. The engineer does not set the absolute level of the red "knob" (which would be write mode). In this case he mixes in the desired degree of updating to previously programmed levels. If the engineer returns the red "knob" to the green "knob," the moment that the levels of the two "knobs" match exactly and the red "knob" disappears, the null condition is returned to, which is signified by both LED NULL indicators 20 being on and only the green knob in the bargraph 12 being visible.

The above description explains what happens when update is entered by pressing the UPDATE button 26.

When update is entered by moving the belt 10 (instead of pressing the UPDATE push button 26), only one of the LED NULL indicators 20 in the direction that the belt 10 was moved comes on initially since, in this case, update is entered by leaving what would have been the null position, so that some level updating (at least a fraction of a db) occurs immediately. Thereafter, however, the LED bargraph display 12 and the LED NULL indicators 20 respond identically to the way they did when update was initiated by pressing the UPDATE button 26.

The above description of the LED bargraph 12 display during various fader operations is similar to the circular LED array 38 display during potentiometer operation as well.

The most special and novel characteristic of the present invention can be described and understood at this point. First, it is important to reiterate that the present invention is, physically, a positionless control relative to its throw or rotation range. The fader incorporates an endless belt I 0 and the potentiometer incorporates an endless knob 36. In the case of an endless belt fader or any typical soft control, as mentioned previously, one thing that would be occasionally disorienting for engineers/operators is the lack of a manual stop that is inherent in a conventional physical knob fader at the top and bottom of the throw. The reason it would be disorienting is that a busy engineer is often watching sound levels on the meter bridge, or looking at and communicating with performers in the studio area, or otherwise has his eyes directed away from the controls he is operating. He often has no time to even glance at the controls to see whether he's reached the top or bottom of a throw. Without a physical stop, a stop relayed to the operator by feel, the engineer may, for example, continue to try to increase a level uselessly if the level has already reached the top of the control range. Conversely, he couldn't know for sure when he's brought the fader all the way down and no longer needs to keep turning it down, unless he looks at its readout. Therefore, although an endless control would provide all of the superior advantages described previously over existing controls on today's automated consoles, it would still have this one serious drawback.

The solution, and one of the single most unique features of the present invention, is that it provides a level-activated electromechanical stop (FIGS. 5a and 5b)). When the engineer has moved the fader up to the full extent and range of its control, the electromechanical stop is activated to prevent further upward travel of the belt 10, thereby giving this information to him through manual feedback. The same method is used to provide a physical stop and manual feedback to the operator at the bottom of the throw. In other words, although the belt 10 is essentially of endless design, it is brought to a stop exactly like a conventional knob fader when a control level extreme is reached.

FIGS. 5a and 5b show the electromechanical stop that has been devised for the present control. It is, in effect, an electromagnetically switchable ratchet wheel, with the difference being that it often allows rotation in both directions instead of just one. In the present invention, either operational control level extreme triggers it's own electromechanical stop, that is, the control utilizes two stops, one to stop motion in one direction and the other to stop motion in the opposite direction. Each electromechanical stop is identical to the other but each one is assigned it's own pulley so that they are in mirror-opposite positions relative to each other within the fader. In FIG. 5a and 5b the major parts of the electromechanical stop are shown which comprises a solenoid 52, a plunger 53, a pivot fork 54, a pawl 55, a pawl stop 56, a spring 57 and a pivot pin 58. In addition, a solenoid clamp 60 and a support bar 62, which secure the electromechanical stop in place by attaching to the fader walls at the hub of the pulley 44 is shown. The pawl 55 interacts with the pulley 44 (the pulley 44 is also shown in FIG. 6).

FIGS. 7a–c shows the electromechanical stop at progressive stages of operation. The solenoid 52, being the push-type, is indicated in its "off" position in FIG. 7a, where the plunger 53 is retracted into the solenoid 52. In FIG. 7b a digital code representing the minimum or maximum control level operational limit in the processor 48 has been reached whereupon the processor 48 sends a signal through conductors to the solenoid 52. The signal causes the solenoid 52 to be energized which causes the plunger 53 to shoot out so that it engages one of the teeth 64 in the pulley 44, thereby preventing clockwise rotation. However, the pulley 44 may still be moved in a counterclockwise direction due to resiliency of the spring 57 contained in the pawl 55, which action is shown in FIG. 7c. Only a very slight counterclockwise motion of the pulley 44, resulting from not more than several millimeters of belt movement, results in an impulse being generated by the shaft encoder 46 which is sent to the processor 48, changing the control level digital code to a code no longer representing a control level operational limit. Whenever this occurs, the processor 48 then sends a release signal to the solenoid 52, de-energizing it, and thus retracting the plunger 53 back into the solenoid 52, returning the mechanism to the condition shown in FIG. 7a, once again allowing free travel of the pulley 44, and thereby the belt 10, in either direction.

FIG. 3 shows both electromechanical stops 51a–b in their relative positions in a full-length side view of the present fader, It will be observed in FIG. 7a that the pawl 55 of the electromechanical stop rests in a straight, parallel position relative to the pulley in FIG. 6. This is due to a combination of the forward rotational pressure of the spring 57 and the smaller rear back-hook of the pawl 55 which presses against the pawl stop 56 which thereby keeps the pawl 55 in the indicated position. It will also be observed that the use of a forked support, pivot fork 54, so-called because it contacts the pawl 55 at its pivot point, allows the Bawl 55 to rotate backward as needed and as shown in FIG. 7c. And, the pawl stop 56 provides a limit as to how far back the pawl 55 may be pushed when its forward hook rides up on the teeth of the reversing pulley 44, although the spring 57 normally should keep the pawl in a functional position.

A point to be mentioned here is that a control level operational limit digital code need only be initially utilized to trigger the electromechanical stop when that code was reached via updating pulses directly from the shaft encoder 46. If the belt is not being rotated manually, and the operational limit digital code was reached from inputting that code directly from the console's CPU during read or update modes, there is no need for the electromechanical stop to be activated at that time. The processor 48 is factory-programmed to delay the activation of the electromechanical stop until, and if, the belt 10 is attempted to be rotated in the same direction that would have eventually caused the current operational limit digital code to be reached. In this case, one or two shaft encoder impulses representing this direction, which can have no further effect on the digital code itself which has already been updated to the operational limit, causes the processor 48 to trigger the electromechanical stop. This programmed functioning of the processor 48 eliminates unnecessary activation of, and thus additional wear and tear on, the solenoid 52.

The potentiometer operates essentially the same as the fader. with the exception that no belt I 0 is involved and both electromechanical stops 51*a–b* interact directly with one shaft encoder 46. The potentiometer's shaft encoder 46 is outwardly shaped like the pulley 44 with teeth 64 for interaction with either electromechanical stop 51. Therefore, FIGS. 5*a*, 5*b*, and 7*a–c* are as equally representative of the potentiometer embodiment as they are of the fader embodiment. In other words, in the present potentiometer, the pulley 44 and the shaft encoder 46 are one in the same thing.

As far as the inventor of the present invention knows, his design of the present electromechanical stop component may be unique. However, any kind of stop/release mechanism that will do the same job as the electromechanical stop is also acceptable. Therefore, the electromechanical stop shown represents a single embodiment of this component part, but not necessarily the only one.

It shall be seen that, whereas it has always been a practical and economic near-impossibility to motorize the potentiometers on densely arrayed console surfaces, a small electro-mechanical stop mechanism can easily be applied to all of the console's variable controls. This provides performance and display superior to what motorized pots could provide. This would also permit total automation, including update, for the first time, of a recording console.

Other details of the present invention are as follows:

1. In FIG. 1B the A & B STATUS indicator LEDs 18 are for future software developments and not currently assigned a function.

2. FIG. 1B also contains an illuminated GLIDE push button 22. Variable glide, or glide, is a standard term for a gradual transition of control level between a channel's last moment of programming (write or update) and the next moment of read which represents previously written levels. Glide is a function that is possible on the present fader when software commands for the rate of speed of this function are provided by the console's CPU in interaction with processor 48. Variable glide causes programming to occur slightly longer, after selecting it to stop, for the purpose of an automated, smooth, gradual transition of level between the end of newly programmed control levels and the return to previously programmed control levels. Glide is often provided by today's computer assisted mixing systems, making it unnecessary to make a perfect manual level match in order to avoid a jump in audio level when bringing a fader back towards the null position when ending update and entering read. The GLIDE LED push button 22 is provided so that the glide function may be switched on or off locally at the fader. The GLIDE push button 22 is an LED indicator which is on when selected and is rapidly blinking or fluttering when glide is actually occurring. An option for the ability to program glide times from the fader's processor 48 may be provided depending upon the request of console manufacturers. In either case, the glide function is normally handled by computation in the console's CPU and not in the fader.

3. The MUTE LED push button 32 is a standard control to simply mute or shut off the audio output from the associated console channel.

4. The SOLO LED push button 34 is a standard control used to shut off all other channels of sound except the channel of the depressed button in the console monitor system.

The present invention, being an endless control which is combined with a level-activated electromechanical stop, provides the first ended/endless control for audio and other electronic signals, Summary, Ramifications, and Scope One breakthrough use of the present invention is as a Key component in making total console automation with update possible and practical for the first time. It accomplishes this in a way that is familiar and comfortable to recording engineers who must work quickly and intuitively. It combines all of the advantages of VCA, motorized, hard, soft, ended and endless controls in a single package for the first time. It contains none of the previously described disadvantages which are characteristic of existing automation controls. It does all of this relatively inexpensively by providing control signals to drive external VCAs or DCAs, yet does not exclude the use of more costly motorized faders where preferred (mentioned below).

In regards to the detailed operation of the invention there are a number of advantages, ramifications and essential points that should be mentioned, as follows:

1. Control swapping on the automation control, by incorporating the shaft encoder 46, can be done more easily than on any other control and with none of the headroom problems or need for manually matching levels as is the case with other automated controls. The present control can accept digital control swapping commands issued from a console's CPU loaded with the appropriate software as preferred and written by individual console manufacturers. For example, the functions of a console's main faders and monitor pots are typically swapped when it is desired to transfer a stereo mix from the monitor faders to the main faders while still doing live overdubs. With the present invention, the monitor pots can continue the job of input level control for overdubbing without having to be readjusted. Control swapping with the present automation control is instantaneous and can even be done in the middle of an over-dub without glitches or level jumps. This is possible because only displays and controls are swapped, not the fader's processors or the console's audio circuitry.

2. The present invention is assignable to the control of functions other than it's default function in the console. It can, for example, control video signal parameters or any control circuitry that can accept incremental pulses or digital codes.

3. Since the control incorporates a shaft encoder 46 and a processor 48, any throw or turn ratios can be programmed into the processor 48. This is done by instructing the processor 48 to register a different value of control level change to each impulse emitted by the shaft encoder. Alternatively, such processing can occur via software in the console manufacturer's console CPU.

4. A potential disadvantage of the present fader would be the possibility of running out of physical finger headroom while operating it. This is because of the extra flexibility of being able move the belt 10 from any point along its length, and therefore operating it from a point other than its operating level where the knob would be in a conventional knob fader. This problem would be particularly likely to occur in an opaque belt such as the Penny and Giles Endless Belt. However, with the present belt 10 plus the bargraph readout 12 of the "knob" position, it will naturally occur that the operator will place his finger on the belt 10 where "knob" is indicated by the LED bargraph 12. Thus, the engineer's finger can move the heir's "knob" from top to bottom without having to reposition his finger. Engineers will undoubtedly find it natural to place their finger tip slightly below the "knob," in order to be able to see it clearly, and, in fact, the present fader has been specifically designed with extra rotatable space on the belt 10 below the bargraph 12 to accommodate this (see FIGS. 1*a* and 1*b*). The space provided may appear excessive for this, but the additional available throw of the belt 10 below the bargraph 12 also assists the operator when throw ratios somewhat longer than the bargraph readout are chosen (when available) through the console's CPU. The additional throw was added to the bottom, rather than the top, so that "knob" display can always appear above the operator's finger. When finger headroom is not a worry, the engineer can operate the belt 10 from any point, regardless of "knob" position. Therefore, there are no inherent problems in the operation of a belt fader, and it is in fact easier to operate than a knob fader. For example, on occasion, one could actually operate two or three adjacent belt faders with the fingers of one hand, since fingers no longer have to reach physical knobs in differing vertical positions.

5. It should be mentioned that in the standard application for recording consoles, the processor 48 in the current control contains memory not only for fader level and operational modes but for the levels of all other variable controls on that fader's channel.

6. It should also be mentioned that the default automation mode recommended to console manufacturer's for the present variable controls situated above the main channel faders will be auto-off mode, even when write or update mode is chosen for the fader. This is simply because, in practice, most variable controls above the main faders are set to static settings throughout a mix and will not require dynamic level mixing during most types of productions. Then, at the end of a mixing session, the recording engineer can take a "snapshot" of those controls to record their settings. This "snapshot," being a global command which is issued from the console's CPU, says in effect, "Record settings of all controls in auto-off mode." These static "snapshot" settings are then automatically reproduced by the console's CPU for those controls the next time that the recording is played back in the read mode. When it is desired to use one such control for dynamic writing, or static or dynamic updating, the control may be switched to write or update mode. This may be chosen exclusively through software written by the manufacturer of the console automation system and the write/update switching for each individual control (above the main fader) would then be chosen centrally from the console's CPU. It is also possible that such control could be programmed into the present fader depending upon console manufacturer requests.

7. An embodiment of the present control has been worked out which can utilize motorized variable resisters for a), superior audio quality; b), a lower cost motorized system than conventional technology can provide; and c), a system that attains total automation with motorized variable resisters for the first time. A complete description of this embodiment is beyond the scope of this, application and may be the subject of a separate patent. However, it is important to note that the same digital code management used by the processor 48 to control VCA and DCA controls can also be applied to motorized controls.

The present control provides the following advantages:

The "knob" position, with an electronic display for faders and potentiometers, is always perfectly representative of control levels, and lets the operator know "where he is" at all times.

Full physical and operational headroom is available at all times.

The need for computer graphic snapshots of control positions is eliminated because the console surface becomes its own snapshot.

A level-activated electromechanical stop provides the reassurance and needed manual feedback of an ended control for the recording engineer.

Time consuming null resetting for the update of hundreds of potentiometers on the console surface is rendered unnecessary with the present control. All controls across the entire console surface can be automated for continuously automatic and instantaneous resetting. This is true even for update which was not possible on Harrison's Series Ten.

Since the present invention is a self-indicating level control device, the operator can see the control level in one glance when he reaches for the control, just like a typical automated, or nonautomated, ended control. He does not have to look first at the control in order to move his hand to it to adjust it and then look elsewhere to observe the results of his action displayed in a remote location as is needed for the Penny and Giles Endless Belt. This is one of the several features that makes the present control very fast to operate.

The present invention combines all of the advantages of VCA, motorized, hard, soft, ended and endless controls into a single package for the first time. It has none of the many disadvantages peculiar to any of these controls which have been described in this application. The present invention contains an electromagnetically switchable ratchet wheel which often allows rotation in both directions simultaneously instead of just one and may be a unique subcomponent of the present invention. The present invention is the first ended/endless control.

The present invention will often be of greatest benefit in systems requiring hard (fixed-function) controls where a great many controls are needed, such as a conventional recording console. This is because a control that does not have to be assigned, but is "grab and go"

in nature, is very fast of operation, plus an endless, shaft-encoder type of control such as this can be used primarily as a hard control even though it is inherently assignable if need be. It is not claimed that a typical endless, assignable shaft-encoder control, which is usually found as the only one of its kind on a synthesizer or audio editing workstation, is not useful as it is. But a conventional endless control would be intolerable for many engineers in applications where a great many potentiometers have to be operated quickly such as those on a recording console surface. A endless control with automatic stops, provided here for the first time, and an indication of its control level at the control itself, instead of a remote screen, is the fastest type of control possible, short of one that could be operated be sheer thought. But, even in the case of the single control on synthesizers or workstations, the present control would be much more convenient and user-friendly than currently available soft/endless controls, since it provides positive manual feedback of operational limits and therefore reduces or eliminates the need to constantly monitor a remote display for control level information. For example, a musician-user in his private studio may wish to make control changes while reading sheet music. His reading would be repeatedly interrupted if he has to be constantly glancing at a display of a control level to know when operational limits are reached in a control without electromechanical stops.

The present invention has potential uses beyond professional audio applications. It can be applied to any instrumentation where a variable control needs to be resettable but a more reliable or less expensive method than using motors would be preferred. Other applicable fields can include:

1. Video equipment and systems;
2. Automation systems such as amusement park rides;
3. Automated equipment in manufacturing plant production lines;
4. Aircraft control instrumentation, and others.

As stated, the present invention will be of greatest value in situations where the operator has to control many functions quickly and is working with a complex control panel or console of some sort where speed is of the essence. And, as also stated, the present control is essential in any application where professional users insist on controls which function "normally" like other controls that they have used and are familiar with. The present control is ideally suited for critical safety applications in computerized environments, such as aircraft and the other applications listed above. This is because a control with a level-activated electromechanical stop relays important information regarding parameter extremes instantly to the pilot or other user. Endless controls also become faster and easier to handle in emergency situations. The operator does not have to see the control to know when the operational extremes are reached. By the same token, automated sound for live performances such as Broadway shows or rock concerts need to be engineered with controls which are as fast and error free in operation as possible, since in live performances there are no second takes.

The basic concept of the present invention has been primarily worked out for audio within the scope of this application but, as stated, it is not limited to audio applications.

The present invention is an ended/endless control.

I claim:

1. An endless belt fader control comprising:
    a housing having an upper surface, said upper surface having an opening formed therein;
    a first pulley and a second pulley disposed within said housing;
    a rotatable belt disposed within said housing and supported by said first pulley and said second pulley, said rotatable belt engaging said first pulley and said second pulley such that movement of said rotatable belt imparts rotation to said first and second pulleys, and said rotatable belt extending substantially along said opening formed within said upper surface of said housing;
    a signal generating means disposed within said housing and being in communication with said rotatable belt for generating electrical signals indicative of said movement of said rotatable belt, said signal generating means being capable of providing said generated electrical signals to a processing unit disposed externally of said housing; and
    a locking means for preventing rotation of said belt in a first direction, said locking means being capable of receiving control signals from said processing unit.

2. The endless belt fader control of claim 1 wherein said signal generating means comprises an incremental encoder.

3. The endless belt fader control of claim 1 wherein, a second locking means is provided for preventing rotation of said belt in a second direction, said second locking means being capable of receiving control signals from said processing unit.

4. The endless belt fader control of claim 1 wherein said rotatable belt is formed from a clear, transparent material.

5. The endless belt fader control of claim 1 further comprising a display for displaying electronic signal levels, said display being disposed between said first and second pulleys such that it may be viewed through said rotatable belt, and said display being capable of communicating with and being controlled by said processing unit.

6. A rotary control comprising:
    a shaft;
    a knob mounted to one end of said shaft;
    a signal generating means operatively coupled to said shaft for generating electrical signals indicative of a rotation of said knob, said signal generating means being capable of providing said generated electrical signals to a processing unit;
    a locking means for preventing rotation of said knob in a first direction, said locking means being capable of receiving control signals from said processing unit.

7. The rotary control of claim 6 wherein said signal generating means comprises an incremental encoder.

8. The rotary control of claim 6 wherein a second locking means in provided for preventing rotation of said knob in a second direction, said second locking means being capable of receiving control signals from said processing unit.

* * * * *